(12) United States Patent
Bez et al.

(10) Patent No.: US 7,468,535 B2
(45) Date of Patent: Dec. 23, 2008

(54) SELF-ALIGNED INTEGRATED ELECTRONIC DEVICES

(76) Inventors: Roberto Bez, Via Vespri Siciliani, 2, 20146 Milan (IT); Alessandro Grossi, Via Lario, 8, 20159 Milan (IT)

( * ) Notice: Subject to any disclaimer, the term of this patent is extended or adjusted under 35 U.S.C. 154(b) by 0 days.

(21) Appl. No.: 10/713,538

(22) Filed: Nov. 14, 2003

(65) Prior Publication Data

US 2004/0173869 A1 Sep. 9, 2004

(30) Foreign Application Priority Data

Nov. 15, 2002 (IT) ............................. TO2002A0997

(51) Int. Cl.
*H01L 29/76* (2006.01)

(52) U.S. Cl. ............................. 257/314; 257/E21.209; 257/499

(58) Field of Classification Search ................. 257/499, 257/528, 536, 506, 509, 510, 314, 315, E21.209; 438/424, 425, 499
See application file for complete search history.

(56) References Cited

U.S. PATENT DOCUMENTS

| | | | |
|---|---|---|---|
| 5,449,636 A | 9/1995 | Park et al. | |
| 6,090,661 A | 7/2000 | Perng et al. | |
| 6,362,071 B1 | 3/2002 | Nguyen et al. | |
| 6,373,083 B1 | 4/2002 | Oh | |
| 6,403,421 B1 * | 6/2002 | Ikeda et al. | 438/267 |
| 6,420,729 B2 | 7/2002 | Kivakaruni et al. | |
| 6,448,606 B1 | 9/2002 | Yu et al. | |
| 6,696,742 B2 * | 2/2004 | Deml et al. | 257/510 |
| 6,794,708 B2 * | 9/2004 | Mori | 257/314 |
| 6,989,303 B2 * | 1/2006 | Mori | 438/201 |
| 7,170,786 B2 * | 1/2007 | Chien et al. | 365/185.17 |
| 2001/0005616 A1 * | 6/2001 | Kim | 438/296 |
| 2001/0052610 A1 | 12/2001 | Leung et al. | |
| 2002/0009815 A1 * | 1/2002 | Sugihara et al. | 438/18 |
| 2002/0019114 A1 | 2/2002 | Trivedi | |
| 2002/0072197 A1 | 6/2002 | Kang et al. | |
| 2003/0006476 A1 * | 1/2003 | Chen et al. | 257/510 |
| 2003/0153148 A1 * | 8/2003 | Chang | 438/257 |

OTHER PUBLICATIONS

European Search Report for EP 03 10 4191 dated Nov. 5, 2004.

* cited by examiner

*Primary Examiner*—Bradley K Smith
(74) *Attorney, Agent, or Firm*—Schwabe Williamson & Wyatt

(57) ABSTRACT

A process for self-aligned manufacturing of integrated electronic devices includes: forming, in a semiconductor wafer having a substrate, insulation structures that delimit active areas and project from the substrate; forming a first conductive layer, which coats the insulation structures and the active areas; and partially removing the first conductive layer. In addition, recesses are formed in the insulation structures before forming said first conductive layer.

17 Claims, 6 Drawing Sheets

SELF-ALIGNED INTEGRATED ELECTRONIC DEVICES

PRIORITY CLAIM

This application claims priority from Italian patent application No. TO2002A 000997, filed Nov. 15, 2002, which is incorporated herein by reference.

TECHNICAL FIELD

The present invention relates to a process for self-aligned manufacture of integrated electronic devices.

BACKGROUND

As is known, in modern microelectronics, reduction of the overall dimensions of devices is one of the main objectives. In particular, in the fabrication of memories of a non-volatile type, it is important to minimize the overall dimensions of each memory cell. The need to obtain an increasingly wider integration scale entails, however, certain difficulties. In some cases, for example, the alignment of the masks used in the different processing steps using traditional processes calls for a precision that, in practice, is frequently not possible to achieve. In particular, a major problem is to align the masks normally utilized, on the one hand, for defining the active areas accommodating the memory cells and, on the other, for shaping the polysilicon layer extending on top of the active areas and forming the floating gates of the cells.

So-called self-aligned processes have consequently been developed, and enable the more critical masking steps to be eliminated, exploiting the surface conformation of the wafer. For greater clarity, reference may be made to FIGS. 1 to 4, showing a semiconductor wafer 1 having a substrate 10, for example of monocrystalline silicon. The wafer 1 comprises conductive active areas 2, insulated by shallow-trench-insulation (STI) structures 3, or else, alternatively, by insulation structures formed through local oxidation of silicon (LOCOS). In practice, the insulation structures 3 comprise trenches of a preset depth, filled with silicon dioxide. In either case, the insulation structures 3 project from the surface 4 of the wafer 1, adjacent to the active areas 2; in this way, the insulation structures 3 define recesses 5 exactly on top of the active areas 2.

Channel regions of memory cells (not illustrated herein) are made inside the active areas 2 by implanting and diffusing dopant species and using thermal oxidation; then a thermal oxidation provides a gate oxide layer 7, of the thickness of a few nanometers. Subsequently, a conductive polysilicon layer 8 is deposited, as illustrated in FIG. 2.

The conductive layer 8 fills the recesses 5 and has a thickness such as to cover completely the projecting portions of the insulation structures 3.

Next (FIG. 3), a chemical-mechanical-polishing (CMP) planarization is performed, which is stopped when the insulation structures 3 are again exposed. In this way, the entire polysilicon layer 8 is removed, except for residual portions, which occupy the recesses 5 and are consequently perfectly aligned to the active areas 2. In practice, the residual portions of the polysilicon layer 8, which are insulated from the respective active areas 2 thanks to the oxide layer 7, form floating gates 11 of the memory cells.

The process further comprises forming an insulating layer 12, which coats the floating gates 11 of the polysilicon layer 8, and depositing a further polysilicon layer, which is in turn defined for forming control gates 13 of the memory cells.

The known self-aligned processes, although advantageous as regards the possibility of increasing the integration scale, present, however, other limitations. Traditional processes, in fact, enable passive components (normally resistors and capacitors) to be formed on top of the insulating structures. In particular, these components and floating gates of the memory cells may be formed starting from the same polysilicon layer using a single mask. This is particularly useful for forming parts of read/write circuits of the memory cells, which are normally integrated in the same wafer, but must withstand much higher voltages and currents. The gate oxide is in fact too thin for eliminating the inevitable capacitive coupling of the high-voltage passive elements with the substrate and is highly subject to breakdown if subjected to high voltages. In addition, traditional processes enable standard cells and high-performance cells to be formed in the same wafer. In particular, in the high-performance cells, the floating terminal is shaped so as to extend in part also outside of the active areas and is consequently better coupled to the control gate: these cells may consequently be driven more rapidly and/or with lower voltages.

It is, however, evident that known self-aligned processes do not enable either passive components or high-performance cells to be formed on top of the insulating structures. On the one hand, in fact, the CMP treatment removes completely the polysilicon overlying the insulating structures, where no conductive material is available to form electrical components; it is consequently necessary to depose and define a new polysilicon layer. On the other hand, precisely because the processes are self-aligned, the recesses where the floating gates of the cells are formed have the same dimensions as the underlying active areas and consequently it is not possible to improve the coupling.

SUMMARY

An embodiment of the present invention provides a self-aligned process for manufacturing integrated electronic devices, the process being free from the drawbacks described above.

BRIEF DESCRIPTION OF THE DRAWINGS

For a better understanding of the invention, some embodiments thereof are now described purely by way of non-limiting example and with reference to the attached drawings, wherein.

DETAILED DESCRIPTION

Figure 1:
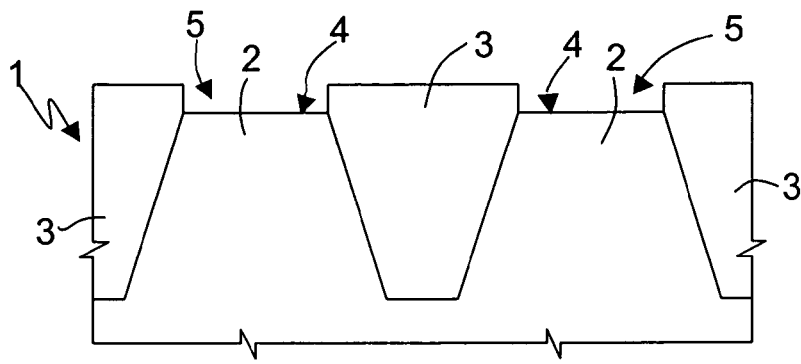
FIGS. 1 to 4 are cross-sectional views through a semiconductor wafer in successive fabrication steps of a process according to the prior art.
Figure 2:
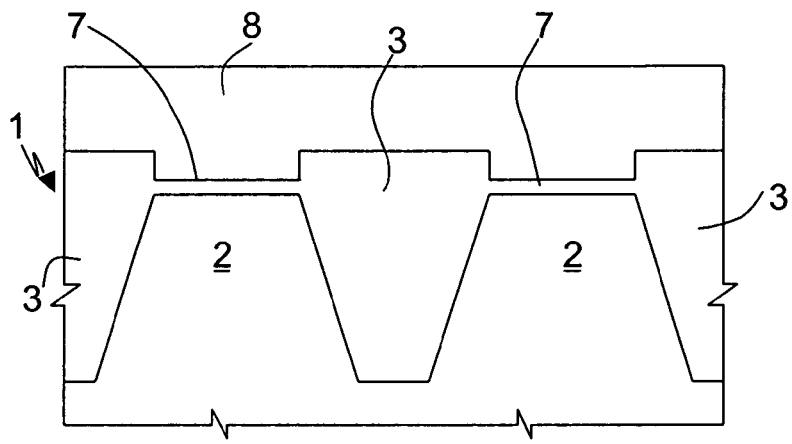
Figure 3:
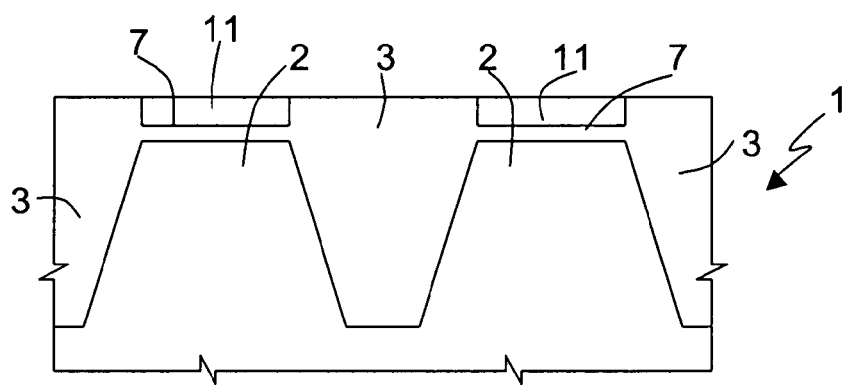
Figure 4:
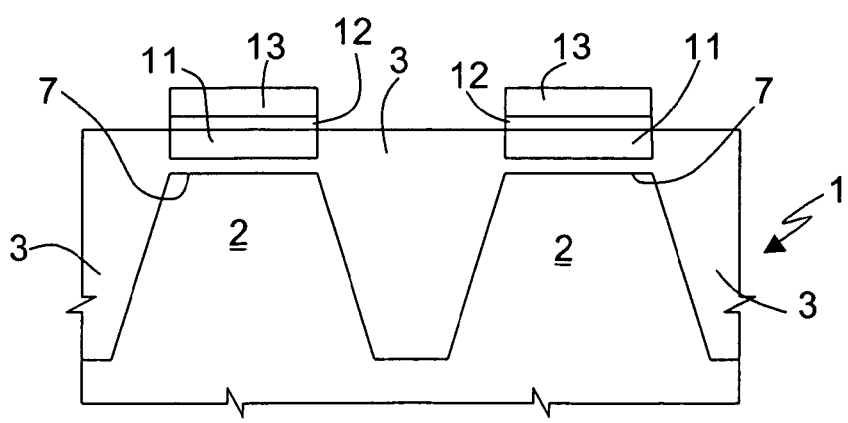
Figure 5:
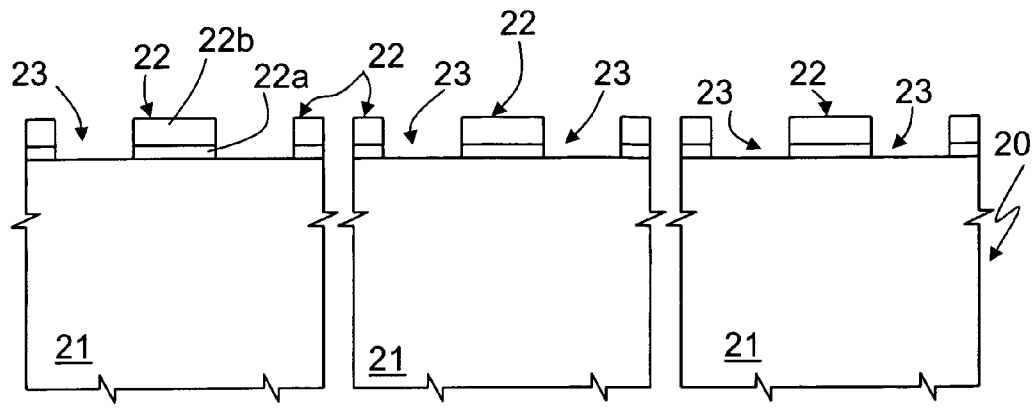
FIGS. 5 to 16 are cross-sectional views through a semiconductor wafer in successive fabrication steps of a process according to a first embodiment of the present invention.
Figure 6:
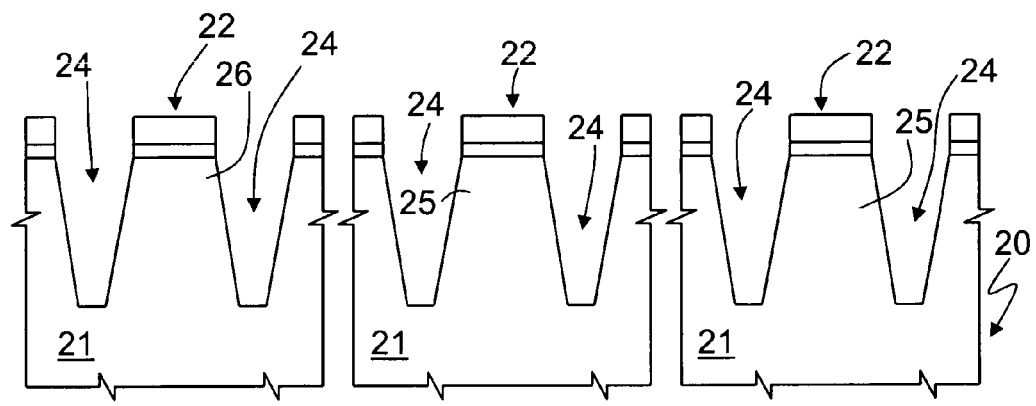

Hereinafter, the process according to an embodiment of the invention is described as being used to manufacture non-volatile memories, in particular of EEPROM or flash type; this is not, however, to be considered limiting, in so far as the process may be used also in electronic devices of another type.

With reference to FIGS. 5 to 16, a semiconductor wafer 20, preferably of silicon, has a substrate 21, for example of P type.

Initially, a hard mask 22 is formed on the wafer 20; the hard mask 22 comprises a pad oxide layer 22a and a silicon nitride layer 22b and has openings 23. Using the hard mask 22, the substrate 21 of the wafer 20 is etched, and trenches 24 are opened, which delimit memory active areas 25 and circuitry active areas 26, where memory cells and, respectively, read/write circuits and control circuits (FIG. 6) will subsequently be formed.

Figure 7:
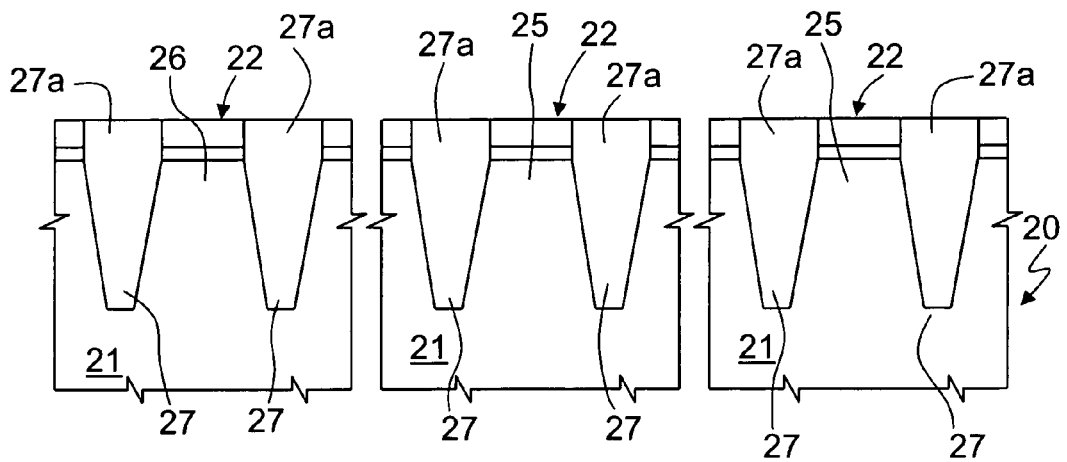

After a thermal-oxidation step, optimizing the profile of the trenches 24, the trenches 24 are filled with dielectric material, here silicon dioxide. The wafer 20 is then planarized with a first chemical-mechanical-polishing (CMP) treatment; in particular, the CMP treatment is interrupted when the hard mask 22 has been reached, as illustrated in FIG. 7. At this point, in practice, the active array areas 25 and circuitry-active areas 26 are delimited laterally by trench insulation structures 27, which extend in part inside the substrate 21 and have projecting portions 27a projecting at the top from the substrate 21 and aligned with the hard mask 22.

Figure 8:
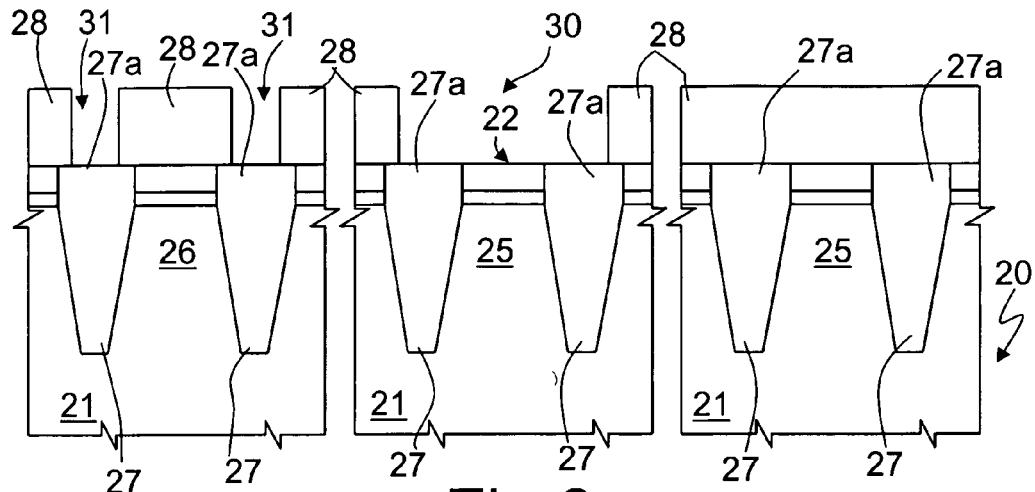

Subsequently, a resist mask 28 is formed on top of the wafer 20 and has first and second openings 30, 31 (see FIG. 8). In detail, the first openings 30 are formed on top of some of the memory active areas 25, where high-performance cells are to be formed. More precisely, the first openings 30 expose portions of the hard mask 22 that overlie these active memory areas 25 and, furthermore, laterally expose the projecting portions 27a of the insulation structures 27 adjacent to them. The second openings 31, instead, centrally expose the projecting portions 27a of the insulation structures 27, which delimit the circuitry active areas 26. The remaining memory active areas 25, designed to accommodate standard cells, are covered by the resist mask 28.

Figure 9:
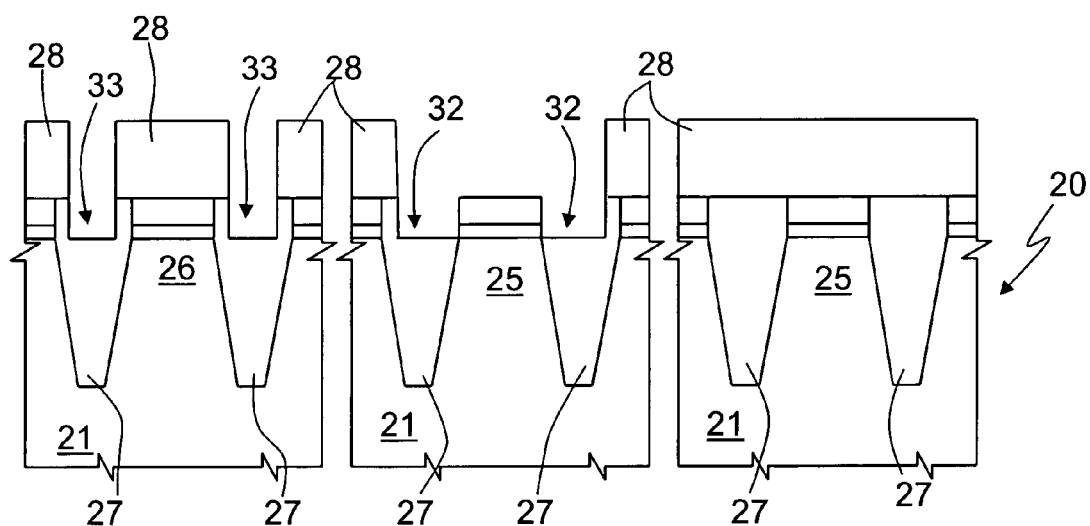

Then the exposed silicon-dioxide portions are etched in a controlled way, as illustrated in FIG. 9. In this step, in particular, first and second recesses 32, 33 are formed inside the insulation structures 27, which delimit the memory active areas 25 and, respectively, the circuitry active areas 26. In practice, the first recesses 32 are delimited at the bottom and on one side by the respective insulation structures 27 and, on the opposite side, by portions of the hard mask 22, which coat memory active areas 25. The second recesses 33 are, instead, formed completely inside the insulation structures 27, defining the circuitry active areas 26. In greater detail, the second recesses 33 are opened and accessible at the top and are delimited laterally and at the bottom by the respective insulation structures 27.

Figure 10:
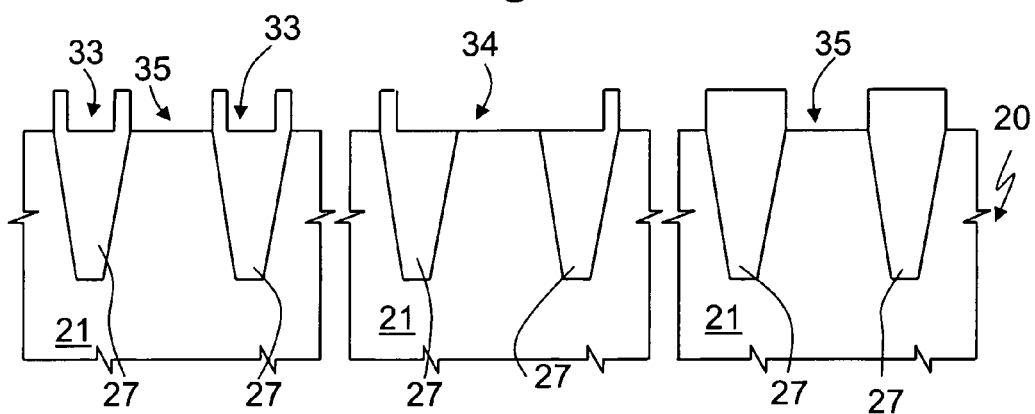

Next, the resist mask 28 and the hard mask 22 are removed, as illustrated in FIG. 10. At this point, in practice, the first recesses 32 are connected to one another and form, in pairs, cavities 34 above the respective memory active areas 25; furthermore, third recesses 35 are defined on top of the memory active areas 25 intended to accommodate standard memory cells, and are delimited laterally by pairs of insulation structures 27.

In a known way, ion-implantation and diffusion are then performed for forming channel regions of memory cells (not illustrated herein for convenience) in the memory active areas 25; simultaneously, electronic components are provided in the circuitry-active areas 26 and form read/write and control circuits 36, here indicated only schematically.

Figure 11:
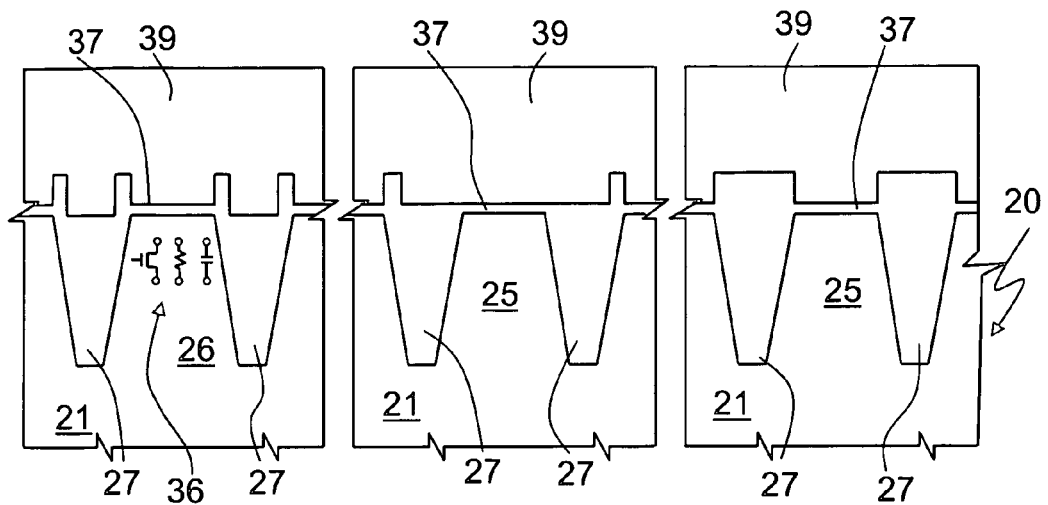

Subsequently, a gate oxide layer 37 with a thickness of a few nanometers is grown thermally, and coats both the memory active areas 25 and the circuitry active areas 26 (FIG. 11). A first polysilicon layer 39 is then deposited on the wafer 20, coats the entire wafer 20, and fills the second and third recesses 33, 35 and the cavities 34.

Figure 12:
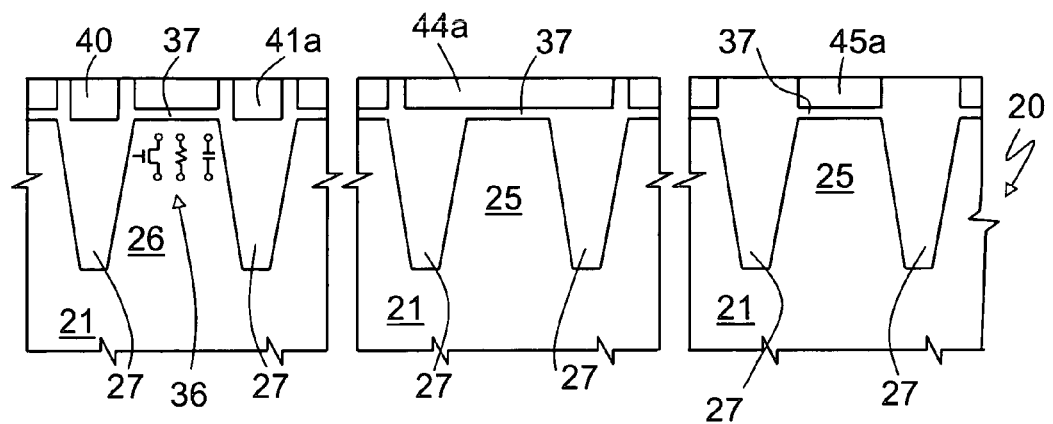
Figure 13:
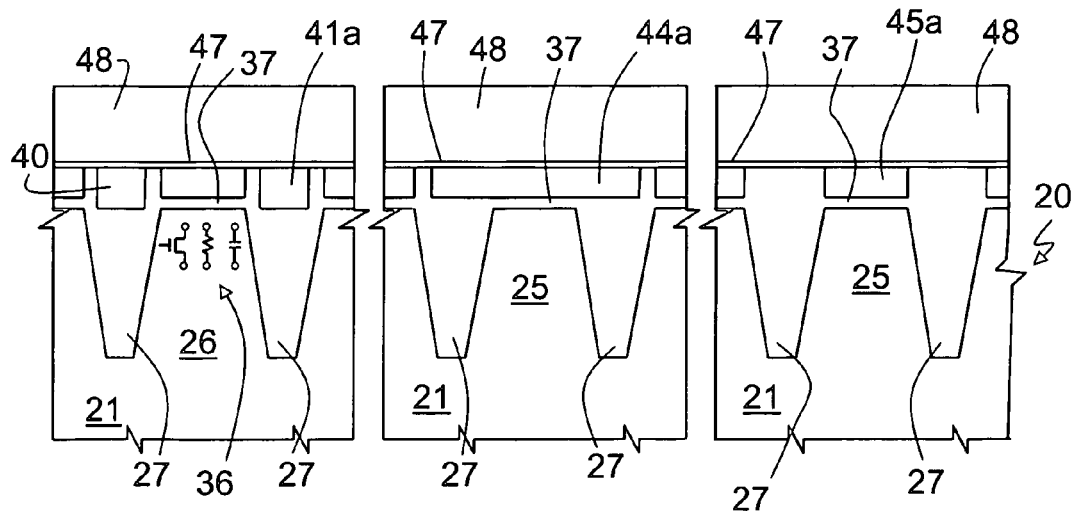
Figure 14:
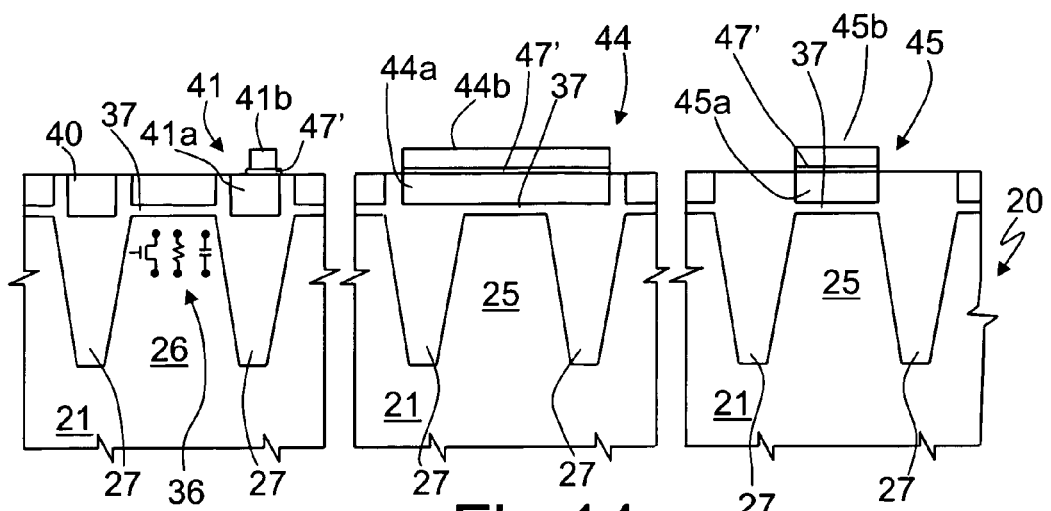

The wafer 20 is then planarized with a second CMP treatment, which is stopped when the insulation structures 27 are again exposed, as illustrated in FIG. 12. In this step, the first polysilicon layer 39 is removed completely, except for residual portions inside the second recesses 33, the cavities 34 and the third recesses 35, which form, in the first case, resistors 40 and first plates 41a of capacitors, and in the other cases, floating gates 44a, 45a of high-performance memory cells and standard memory cells, respectively. In this way, in practice, just one deposition of polysilicon, followed by a planarization step, enables conductive regions to be formed which extend entirely (resistors 40 and first plates 41a) or partially (floating gates 44a) on top of insulation structures 27. The steps described above are moreover self-aligned, in so far as they are formed by exploiting the surface conformation of the wafer 20.

Then a dielectric layer 47 and a second polysilicon layer 48 are deposited (FIG. 13) and selectively etched for forming capacitors 41, high-performance cells 44, and standard cells 45. In particular, referring to FIG. 14, starting from the second polysilicon layer 48, second plates 41b are formed on top of the first plates 41a, and control gates 44b, 45b are formed on top of the floating gates 44a, 45a of high-performance cells 44 and standard cells 45, respectively. In addition, the second plates 41b and the control gates 44b, 45b are insulated from the underlying conductive regions (first plates 41a, floating gates 44a, 45a) by respective residual portions 47 of the dielectric layer 47. Clearly, the floating gates 44a and control gates 44b of the high-performance cells have a greater capacitive coupling than those of the standard cells, since they have a larger surface. They extend, in fact, beyond the respective active areas 25 and occupy the first recesses 32 of the adjacent insulation structures 27.

Figure 15:
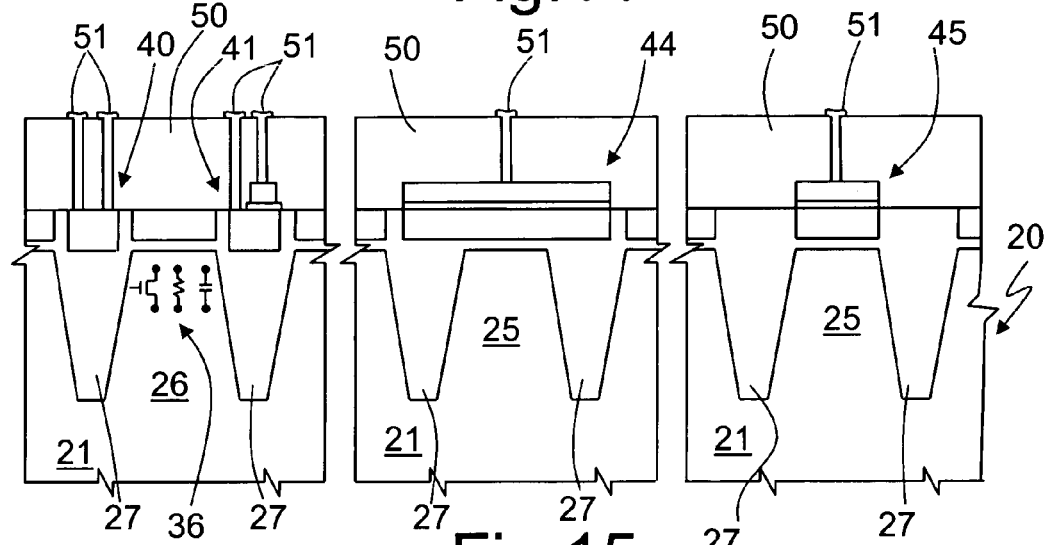
Figure 16:
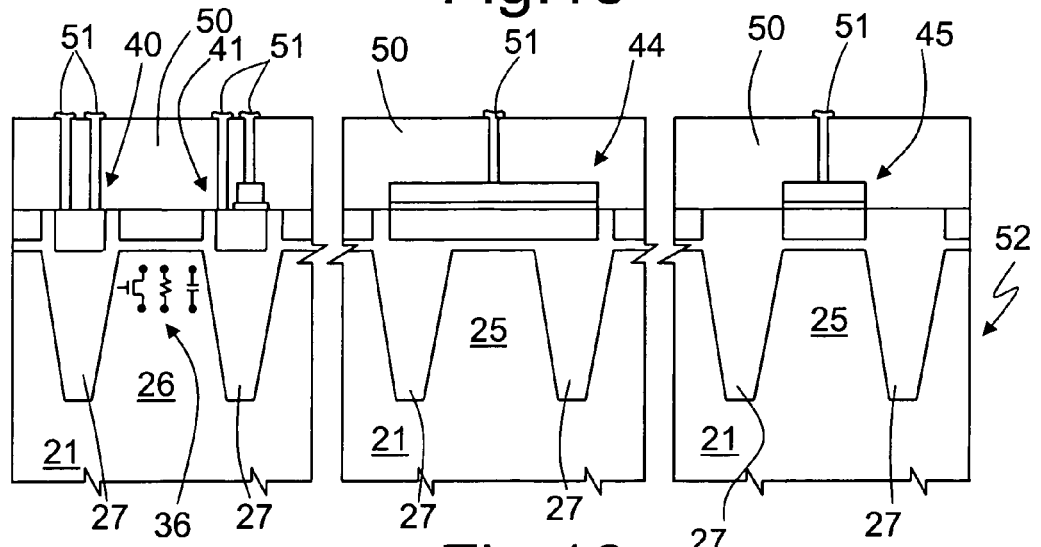

Referring to FIG. 15, the process then comprises depositing a protective dielectric layer 50, for example of silicon dioxide, and opening contacts 51 through the protective layer 50. Finally, the wafer 20 is divided into individual dice 52, as illustrated in FIG. 16; each die 52 comprises a respective electronic device, which, in the described embodiment, is a non-volatile memory.

The process according to the above-described embodiment of the invention is clearly advantageous, because, through the addition of just one masked etch of the insulation structures 27, it enables both passive components presenting excellent insulation from the substrate 21 and memory cells with differentiated characteristics and performance to be formed on the same wafer 20.

In particular, the passive components (resistors 40 and capacitors 41) may operate with high voltages, without any risk of breakdown of the insulating dielectric and, furthermore, with a substantially negligible capacitive coupling to the substrate 21. These components are consequently suited for being used in read/write circuits, for example for forming charge pumps. As regards, instead, the memory cells, the process enables cells with high capacitive coupling between the control gate and the floating gate to be formed, in addition to the standard cells.

In this case, the high capacitive coupling is useful because the memory cells formed in this way may be driven with low voltages and hence have optimized performance. Memory cells of this type are particularly advantageous in the case of so-called "embedded" memories, which also integrate high-complexity logic circuits, such as, for example, microcontrollers or digital signal processors (DSPs).

In addition, the definition of the resist mask 28 for etching the insulation structures 27 is not critical and does not present problems of alignment with the active areas. Finally, the process is self-aligned and consequently enables standard cells of extremely contained dimensions to be formed.

Figure 17:
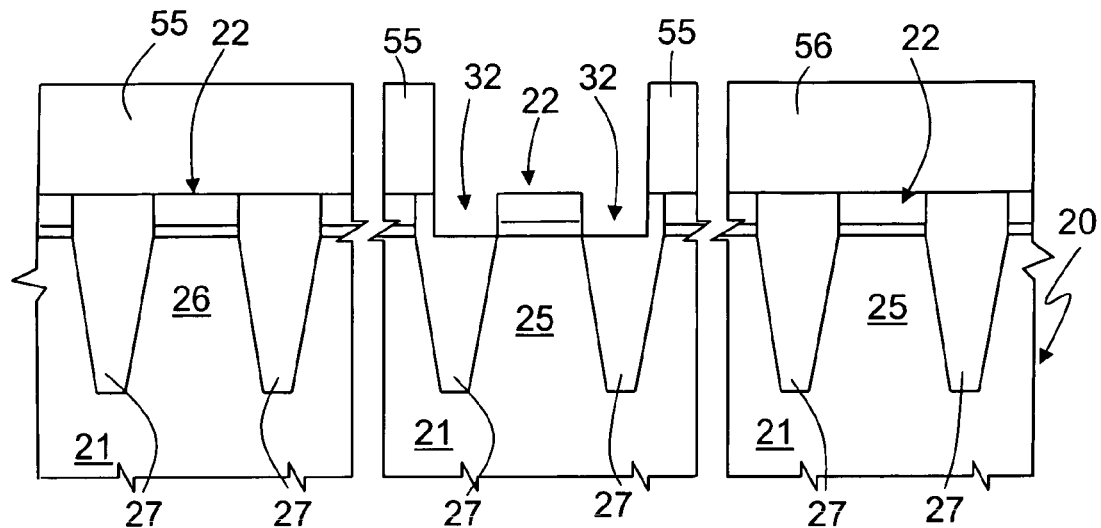
FIGS. 17 and 18 are cross-sectional views through a semiconductor wafer in successive fabrication steps of a process according to a different embodiment of the present invention.
Figure 18:
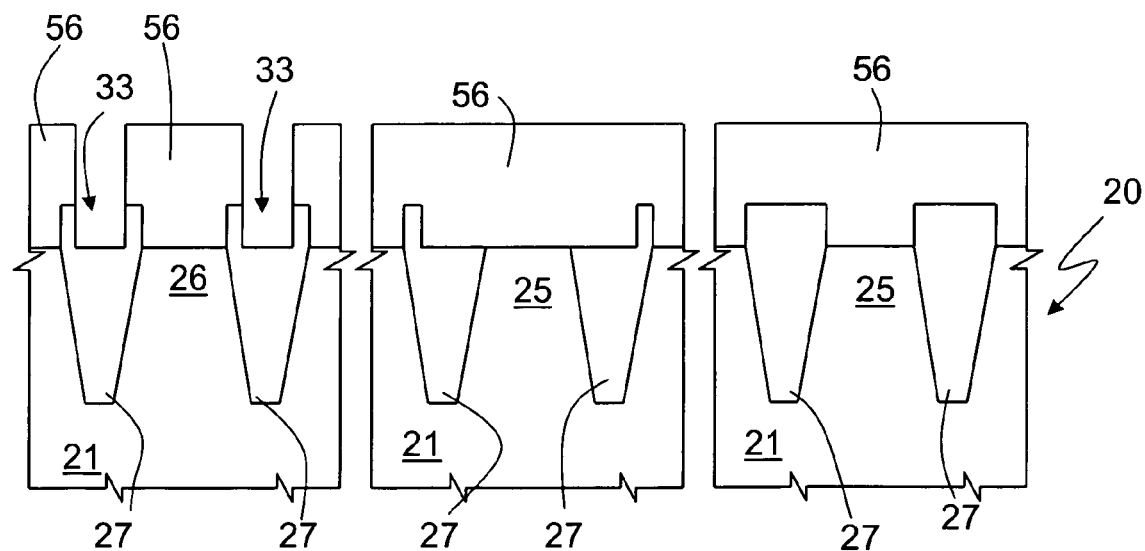

FIGS. 17 and 18, where parts equal to those already illustrated are designated by the same reference numbers, show a different embodiment of the process according to the invention. In this case, after the insulation structures 27 have been formed and the wafer 20 has been planarized via the first CMP treatment, as already described previously, a first resist mask 55 is deposited and defined, to expose only a part of insulation structures 27 delimiting memory active areas 25; the insulation structures which delimit the circuitry-active areas 26 are instead protected (FIG. 17). By a first controlled etch, the first recesses 32 are then formed.

After the first resist mask 55 and the hard mask 22 have been removed, a second resist mask 56 is formed on top of the wafer 20. Now, all the memory active areas 25 and the respective insulation structures 27 are protected, while central portions of the insulation structures, which delimit the circuitry-active areas 26, are left exposed. The wafer 20 is again etched in a controlled way, and the second recesses 33 are formed. The second resist mask 56 is then removed, and the procedure ends with deposition of the first polysilicon layer 39, second CMP treatment, and formation of passive components and memory cells, as already described with reference to FIGS. 11 to 16.

Thereby, the process enables recesses having a differentiated depth to be formed. In particular, it is possible to control the first etch, which is often more critical, with greater precision. The first recesses 32, in fact, typically must accommodate a polysilicon layer of thickness sufficient for withstanding the CMP treatment without undergoing damage, but at the same time typically must never have a depth such as to uncover the memory active areas 25. According to the design specifications of the individual storage device, instead, it could be convenient to form second deeper recesses 33.

Finally, it is evident that modifications and variations may be formed to the process described, without thereby departing from the scope of the present invention. In particular, the steps of masked etching for opening the first and second recesses 32, 33 may be performed either before or after removal of the hard mask 22. The first recesses 32 could be formed also only in the insulation structures 27 which delimit one side of the memory-active areas 25, and not in those which delimit the other sides; in practice, for each memory-active area, only a first recess 32 is defined. In addition, the storage devices obtained according to the above-described processes need not necessarily comprise both passive components formed on top of the insulation structures and high-performance memory cells; instead, the process may also be exploited for forming only resistors, only capacitors, or else only high-performance memory cells. Finally, as already mentioned previously, the process may also be used for forming devices other than non-volatile memories, such as for example volatile memories.

From the foregoing it will be appreciated that, although specific embodiments of the invention have been described herein for purposes of illustration, various modifications may be made without deviating from the spirit and scope of the invention.

What is claimed is:

1. An integrated electronic device comprising:
   a semiconductor body having a substrate;
   a pair of insulation structures disposed in the substrate, delimiting an active area of the substrate, and each having a respective portion projecting from said substrate, the projecting portions defining a recess over a portion of the active area and over a portion of at least one of the insulation structures, said recess having a substantially constant width throughout its vertical dimension; and
   a memory cell having a body region disposed in the portion of the active area, a gate insulator disposed over the body region, a floating gate disposed in the recess over the gate insulator and over the portion of the at least one insulation structure such that the floating gate does not extend above the projecting portions of the insulating structures, and a control gate disposed over the floating gate.

2. The device according to claim 1 wherein:
   said projecting portions define the recess over respective portions of both of the insulation structures; and
   said floating gate is disposed over the respective portions of both the insulating structures.

3. The device according to claim 1 wherein said floating gate does not extend laterally beyond the projecting portions of the insulating structures.

4. The device according to claim 1 wherein said floating gate has a surface facing the control gate, the entire surface being planar.

5. An integrated circuit, comprising:
   a substrate having an active region;
   first and second insulators disposed adjacent to the active region and defining a recess over a portion of the active region and over a portion of at least one of the first and second insulators, said recess having first and second sides that are substantially perpendicular to the surface of the active region;
   a body region of the memory cell disposed in the portion of the active region;
   a first gate insulator disposed over the body region; and
   a floating gate of the memory cell disposed in the recess over the gate insulator and over the portion of at least one of the first and second insulators but not extending beyond the recess in a dimension parallel to a surface of the active region.

6. The integrated circuit of claim 5 wherein the first and second insulators respectively comprise first and second projections that define the recess.

7. The integrated circuit of claim 5, further comprising:
   first and second trenches disposed in the substrate; and
   wherein the first and second insulators are respectively disposed in the first and second trenches.

8. The integrated circuit of claim 5 wherein the first and second insulators define the recess over respective portions of both the first and second insulators.

9. The integrated circuit of claim 5 wherein the floating gate does not extend above the first and second insulators.

10. The integrated circuit of claim 5, further comprising:
    a second gate insulator disposed on the floating gate; and
    a control gate disposed on the second gate insulator and overlapping the floating gate.

11. An integrated circuit, comprising:
    a substrate;
    a first isolation region disposed in the substrate and defining a recess that is bounded by the first isolation region on at least two sides, the first isolation region having a first depth beneath the recess and a second depth outward from the recess along at least one of the at least two sides, the first depth being greater than or equal to the second depth; and
    a first conductor disposed in, and extending no higher than, the recess.

12. The integrated circuit of claim 11 wherein the first insulator comprises projections that define the recess.

13. The integrated circuit of claim 11, further comprising:
a trench disposed in the substrate; and
wherein the first insulator is disposed in the trench.

14. The integrated circuit of claim 11 wherein the first conductor composes a resistor.

15. The integrated circuit of claim 11 wherein the first conductor composes a plate of a capacitor.

16. An integrated circuit, comprising:
a substrate;
a first isolation region disposed in the substrate and defining a recess that is bounded by the first isolation region on at least two sides, the first isolation region having a first depth beneath the recess and a second death outward from the recess along at least one of the at least two sides, the first depth being greater than or equal to the second depth;
a first conductor disposed in the recess;
a second insulator disposed on the first conductor; and
a second conductor disposed on the second insulator and overlapping the first conductor.

17. An integrated circuit, comprising:
a substrate having an active region;
first and second insulators disposed adjacent to the active region and defining a recess over a portion of the active region and over a portion of at least one of the first and second insulators;
a body region of a memory cell disposed in the portion of the active region;
a first gate insulator disposed over the body region; and
a floating gate of the memory cell disposed in the recess over the gate insulator and over the portion of one of the insulators, the floating gate having a substantially constant width throughout its vertical dimension.

* * * * *

UNITED STATES PATENT AND TRADEMARK OFFICE
CERTIFICATE OF CORRECTION

PATENT NO. : 7,468,535 B2 Page 1 of 1
APPLICATION NO. : 10/713538
DATED : December 23, 2008
INVENTOR(S) : Roberto Bez It is certified that error appears in the above-identified patent and that said Letters Patent is hereby corrected as shown below:

In the Claims:

Col. 7, line 13 [Claim 16] "...a second death..." should read --...a second depth...--.

Signed and Sealed this

Seventeenth Day of March, 2009

JOHN DOLL
*Acting Director of the United States Patent and Trademark Office*